(12) United States Patent  
Mikan, Jr.

(10) Patent No.: US 6,667,637 B1
(45) Date of Patent: Dec. 23, 2003

(54) DYNAMIC LOGIC CIRCUIT WITH BETA CONTROLLABLE NOISE MARGIN

(75) Inventor: Donald George Mikan, Jr., Austin, TX (US)

(73) Assignee: International Business Machines Corporation, Armonk, NY (US)

(*) Notice: Subject to any disclaimer, the term of this patent is extended or adjusted under 35 U.S.C. 154(b) by 1238 days.

(21) Appl. No.: 08/824,140

(22) Filed: Mar. 25, 1997

(51) Int. Cl.[7] .............................................. H03K 19/96
(52) U.S. Cl. .............................. 326/98; 326/93; 326/95
(58) Field of Search ............................... 326/23–24, 93, 326/95, 98, 112, 119, 121, 113; 327/408

(56) References Cited

U.S. PATENT DOCUMENTS

| 4,950,925 A | 8/1990 | Doi et al. ...................... 326/84 |
| 5,065,048 A | 11/1991 | Asai et al. ..................... 326/17 |
| 5,440,243 A | 8/1995 | Lyon ............................ 326/33 |
| 5,483,181 A | 1/1996 | D'Souza ........................ 326/98 |
| 5,525,916 A | 6/1996 | Gu et al. ....................... 326/98 |
| 5,546,022 A | * 8/1996 | D'Souza ...................... 326/121 |
| 5,572,151 A | 11/1996 | Hanawa et al. ............. 326/113 |
| 5,650,733 A | * 7/1997 | Covino .......................... 326/24 |

* cited by examiner

Primary Examiner—Vibol Tan
(74) Attorney, Agent, or Firm—Barry S. Newberger; Winstead Sechrest & Minick P.C.; Robert M. Carwell

(57) ABSTRACT

A domino logic circuit has a beta controllable noise margin and an ability to hold an evaluated state until a received clock signal goes to a low state by adding an additional N-channel field effect transistor (NFET) in series with another N-channel field effect transistor, where both of these devices receive the date input signal. Additionally, a P-channel field effect transistor (PFET) also receives the data input signal into its gate electrode. This P-channel field effect transistor is positioned so that it opposes one of the N-channel field effect transistors. The advantages gained by this additional circuitry may also be implemented within a multiplexer circuit.

24 Claims, 5 Drawing Sheets

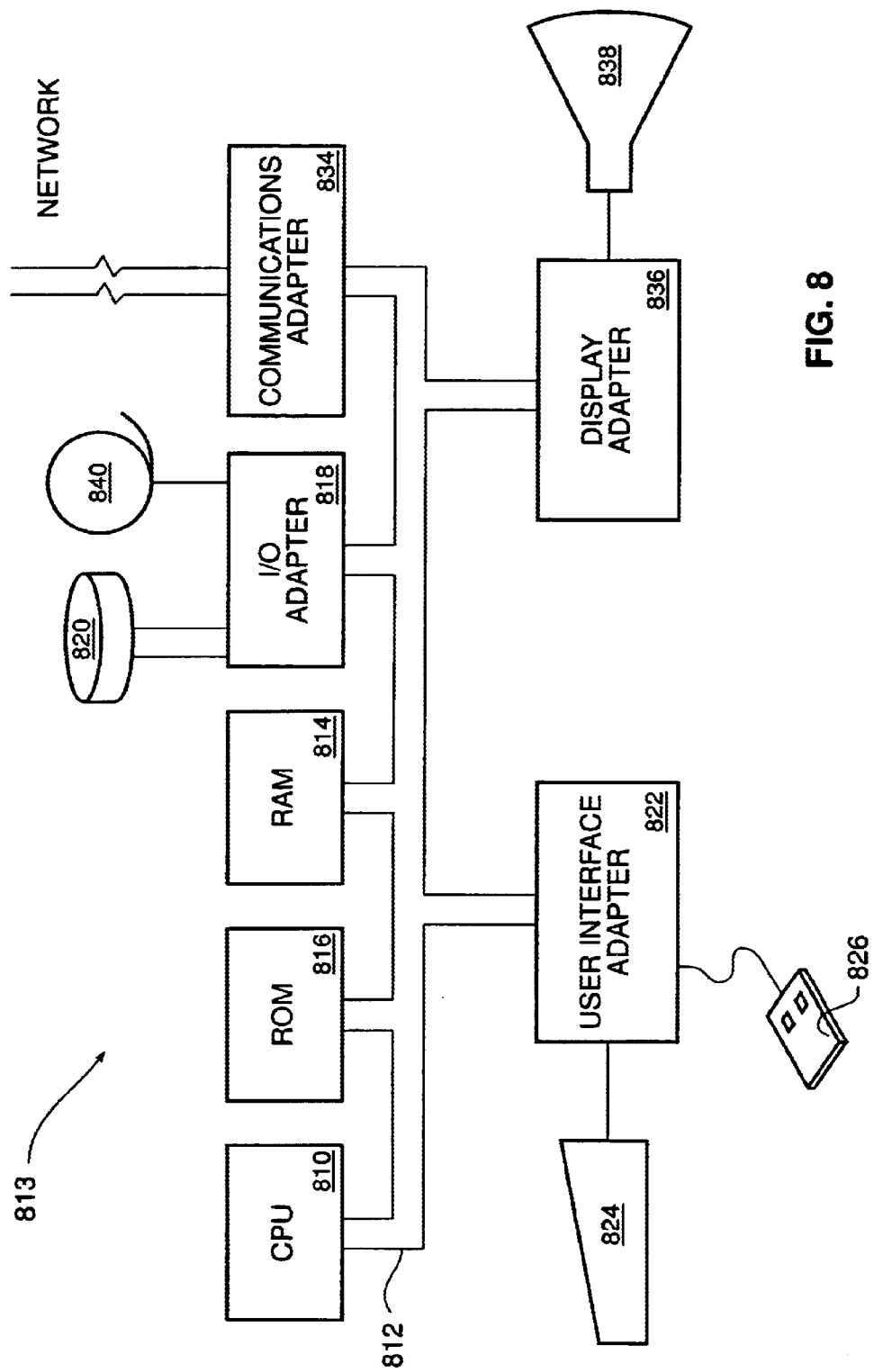

DYNAMIC LOGIC CIRCUIT WITH BETA CONTROLLABLE NOISE MARGIN

CROSS-REFERENCE TO RELATED APPLICATION

The present patent application is related to U.S. patent application Ser. No. 08/547,269, issued as U.S. Pat. No. 5,650,733, Jul. 22, 1997, which is assigned to a common assignee, and which is hereby incorporated by reference herein.

TECHNICAL FIELD

The present invention relates in general to logic circuitry, and in particular, to improving noise margin within a dynamic circuit.

BACKGROUND INFORMATION

Referring to FIG. 1, there is illustrated standard domino logic circuit 100, which has a noise margin that is set predominantly by the threshold voltage of NFET (N-channel field effect transistor) 102. Actually, the noise margin may be slightly higher due to the half-latch current of PFET (P-channel FET) 105, but PFET 105 is typically very small. The functionality of circuit 100 is to evaluate data input received by NFET 101. As an example, the output goes high when the clock signal (CLK) received by NFET 102 is high and the data input signal received by NFET 101 is high. Circuit 100 is reset (output goes low) when the clock signal returns to a low level. This is primarily a result of the receipt of the clock signal by PFET 104, which raises the node input into inverter 103 to a high level.

Circuit 300 illustrated in FIG. 3 improves upon the noise margin by introducing PFET 306 directly opposing NFET 301, which corresponds to NFET 101. Devices 302–305 have corresponding functions to devices 102–105. Circuit 300 is disclosed in cross-referenced U.S. patent application Ser. No. 08/547,269.

However, this solution introduces an undesirable side effect in that circuit 300 may reset depending upon the data input level. More specifically, once circuit 300 has evaluated, it may be reset as a function of the data going low instead of holding its current state until the clock signal goes low. Note that this could occur even for a topology where the device receiving the data input is lower within the "stack" than the device receiving the clock signal. An alternate scheme where the "n" inputs are interchanged is even more obvious.

This results in a slightly different functionality than circuit 100, and could cause problems in circuit families that use signal pulses for the logic (e.g., four-phase, ripple domino, self-resetting, etc.).

Circuit 300 also has testability problems when the topology is extended to multiplexer structures where multiple n-trees are dotted onto the dynamic node. In the case of multiple n-trees dotted onto the dynamic node, one has to ensure that there are no conflicting DC current paths. This may be a difficult task when the applied patterns are under tester control.

Circuit 200 illustrated in FIG. 2 solves the data dependent reset problem by eliminating the data restore path once the circuit has evaluated. The noise margin is set by the beta ratio of the pulldown stack of NFETs 201 and 202 against the pullup stack of PFETs 205 and 206. However, stacking PFETs results in undesired growth to the circuit, since the size of two series PFETs is four times the size of a single PFET for the same strength. In addition to size, performance is degraded due to additional load both on the output and the Data input.

Therefore, there is a need in the art for an improved domino logic circuit that has an improved beta controllable noise margin and which holds its evaluated state until the clock signal goes low.

SUMMARY OF THE INVENTION

The present invention addresses the foregoing need by providing a logic circuit that includes two NFET devices configured in series for receiving a data input signal, and a PFET device also receiving the data input signal and coupled between a reference voltage source and a node coupling the two NFET devices.

In an alternative embodiment of the present invention, the logic circuit of the present invention may be a multiplexer circuit whereby one or more of the "legs" of the multiplexer circuit implements the present invention.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 illustrates a data processing system configured in accordance with the present invention.

DETAILED DESCRIPTION

Figure 1:
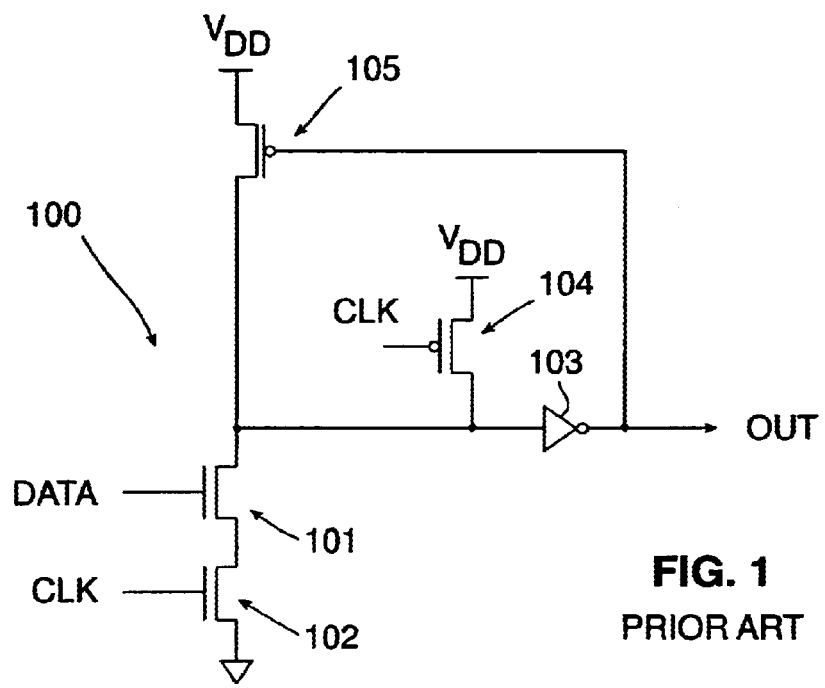
FIG. 1 illustrates a prior art logic circuit.
Figure 2:
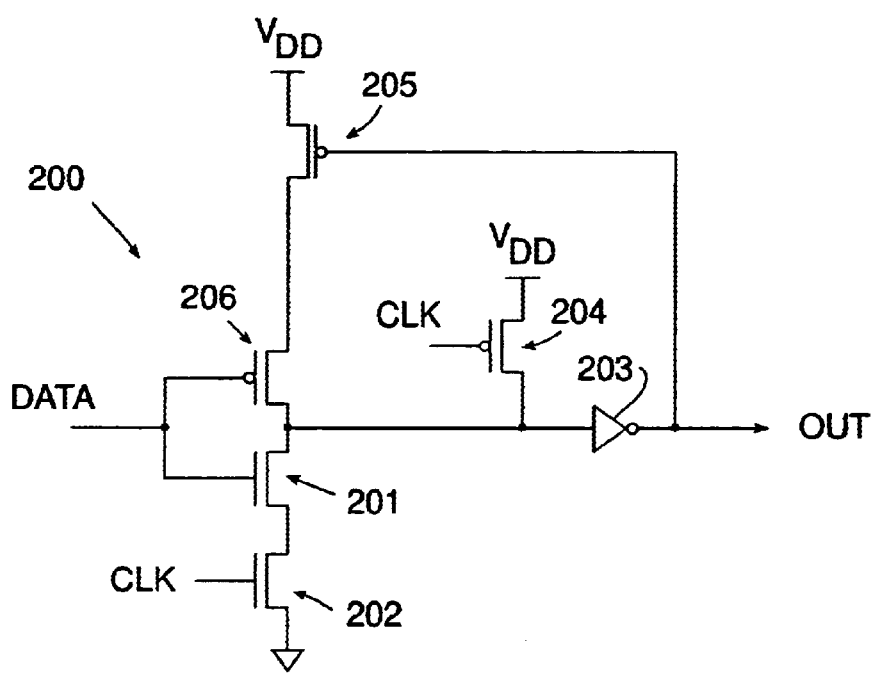
FIG. 2 illustrates a prior art logic circuit.
Figure 3:
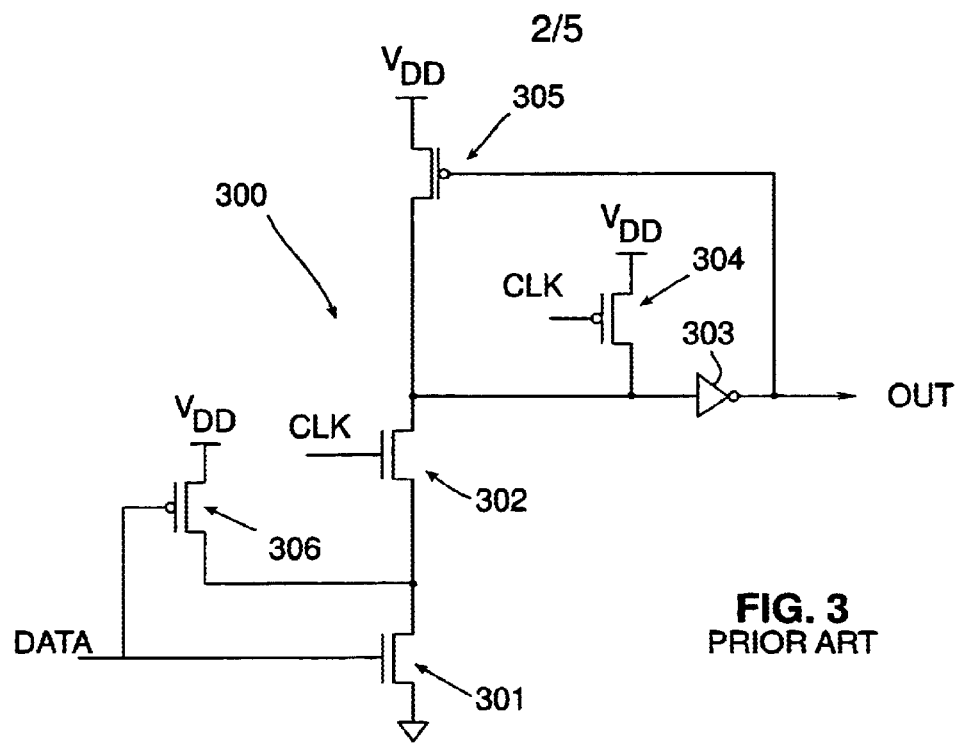
FIG. 3 illustrates a prior art logic circuit, which may reset when a data signal goes low.

In the following description, numerous specific details are set forth such as specific word or byte lengths, etc to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 4:
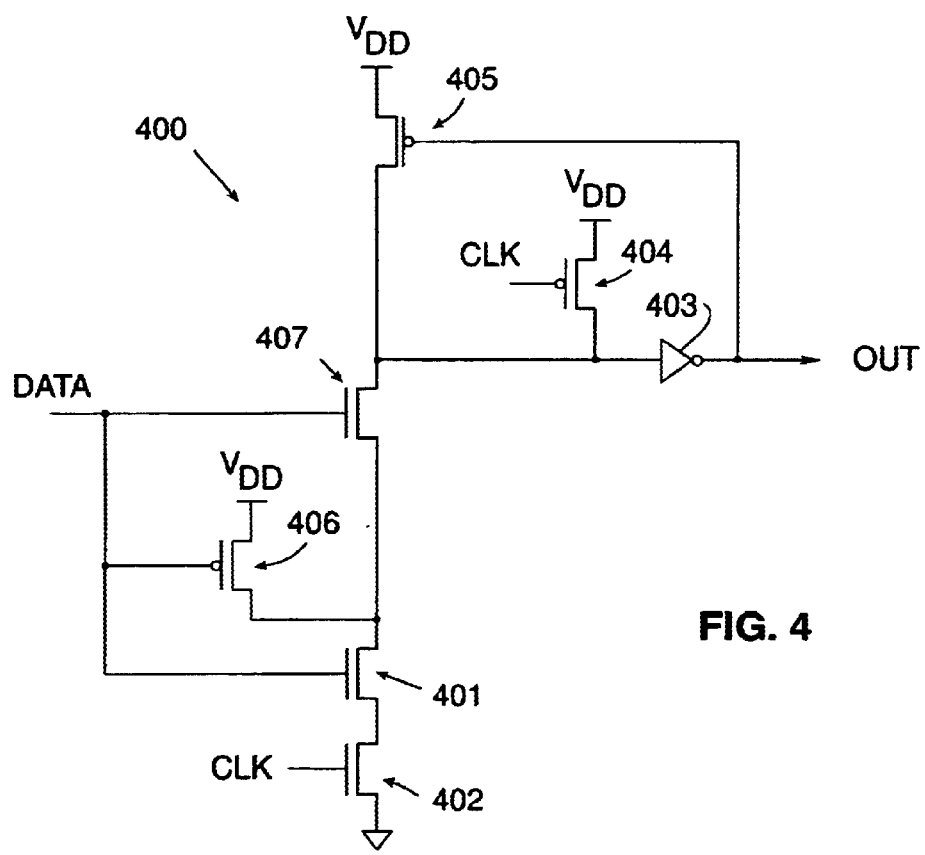
FIG. 4 illustrates an embodiment of the present invention.

Referring next to FIG. 4, there is illustrated logic circuit 400, wherein devices 401–405 essentially correspond to devices 101–105 in circuit 100. Added are devices 406 and 407. Device 407 is an NFET coupled in series with NFET 401, whose gate electrode also receives the data input signal. PFET 406 is coupled between VDD and the node coupling NFETs 401 and 407. The gate electrode of PFET 406 also receives the data input signal.

Circuit 400 performs the same logic functionality as circuit 100, except that the data input signal does not cause premature reset of circuit 400, because the data input signal shuts off the pull-up path. Therefore, circuit 400 has a beta controllable noise margin and holds its evaluated state until the clock signal goes low. Circuit 400 has advantages over circuit 200 in that the P-related area is less, since there are no two PFETs in series. As a result, the beta ratio can be considered more controllable, since it is dependent upon only a single NFET and a single PFET.

Figure 5:
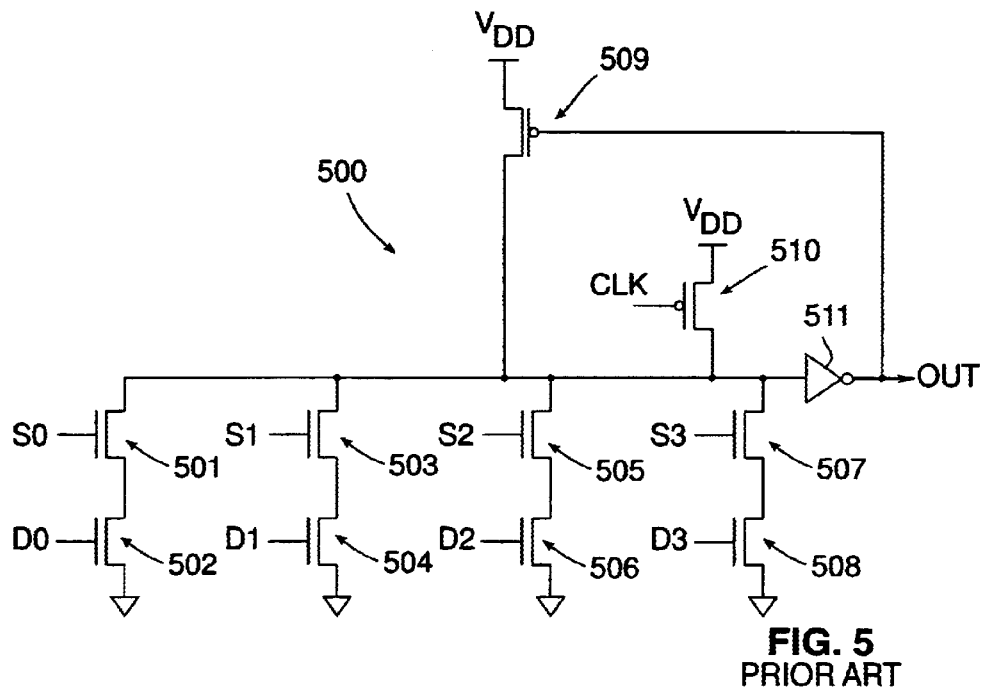
FIG. 5 illustrates a prior art multiplexer circuit.

Referring next to FIG. 5, there is illustrated multiplexer 500. Devices 509–511 essentially perform the same functions as devices 405, 404, and 403, respectively. NFETs 502, 504, 506, and 508 receive data input signals D0, D1, D2, and D3, respectively, while NFETs 501, 503, 505 and 507 receive select signals S0, S1, S2, and S3, respectively. Circuit 500 incurs the same disadvantages as circuit 100.

Figure 6:
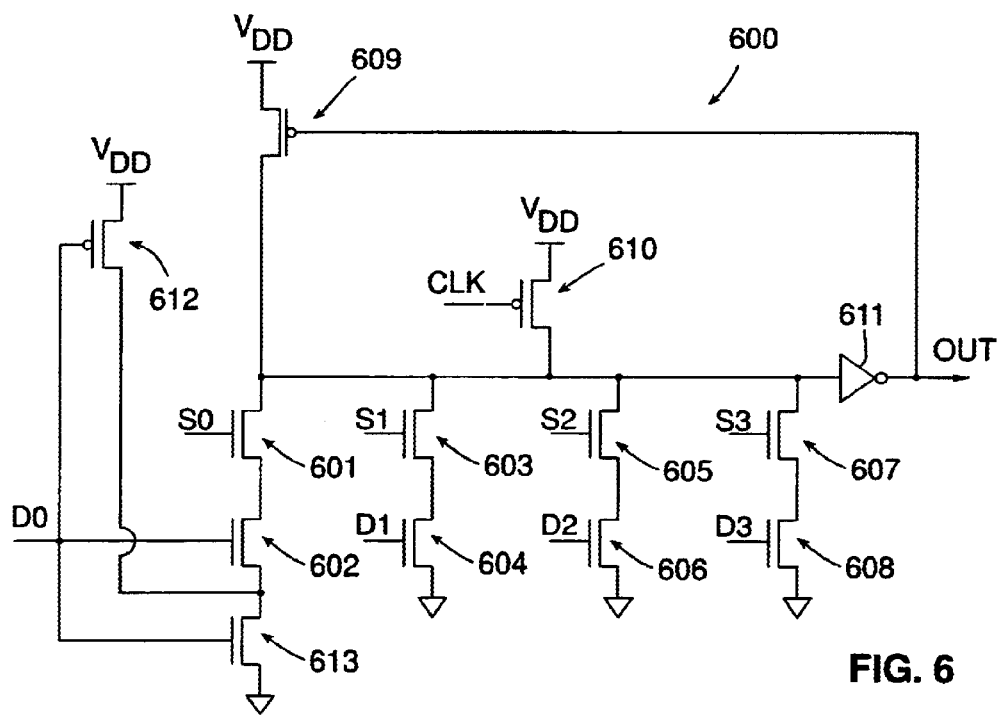
FIG. 6 illustrates a multiplexer circuit, which has one data input, configured in accordance with the present invention.

Referring next to FIG. 6, there is illustrated multiplexer circuit 600, which embodies the advantages of the present invention. Essentially, devices 601–611 correspond in function to devices 501–511. Added are PFET 612 and NFET 613, which along with NFET 602 provide the same configuration as devices 401, 406 and 407 of circuit 400, and also provide the same advantages, which are a beta controllable noise margin and an ability to hold the evaluated state input by data input D0 until the clock signal goes low.

Note that this configuration of devices 602, 612, and 613 may also be used to replace one or more of NFETs 604, 606, and 608 within circuit 600.

Please note that the number of inputs provided into circuit 600 is shown by example only and may be modified by one skilled in the art to any number of "legs" of a multiplexer circuit as desired. Additionally, other configurations of multiplexer circuits and domino logic circuits may also utilize the advantages of the present invention.

Figure 7:
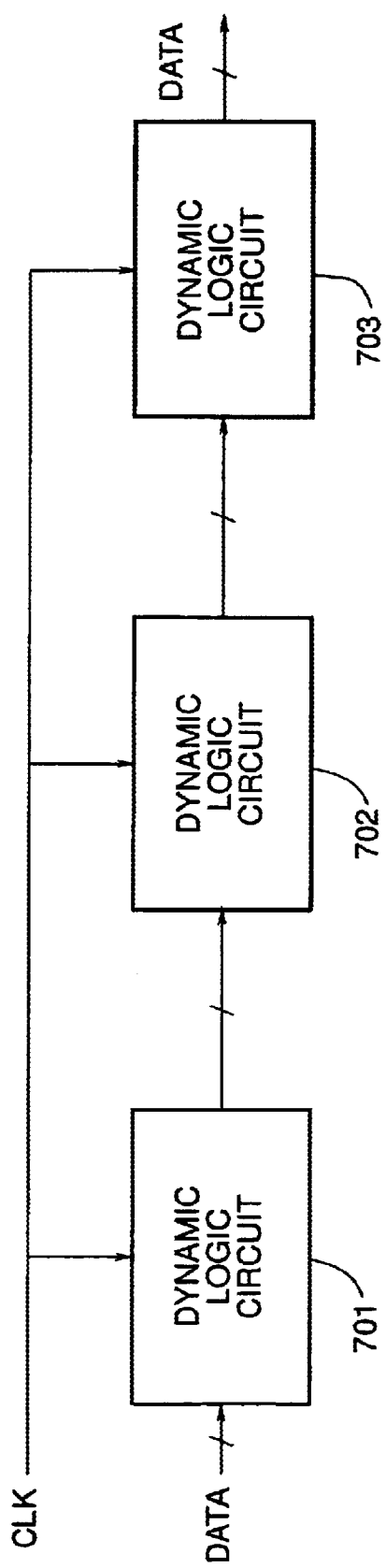
FIG. 7 illustrates domino logic circuitry coupled in series.

Referring next to FIG. 7, there is illustrated domino logic circuits 701, 702, and 703 formed in a typical arrangement whereby each of circuits 701, 702, and 703 receive a clock input signal and one or more data input signals, and produce one or more data output signals. The circuitry shown in FIG. 7 may take advantage of the circuitry of the present invention shown in circuit 400.

A representative hardware environment for practicing the present invention is depicted in FIG. 8, which illustrates a typical hardware configuration of workstation 813 in accordance with the subject invention having central processing unit (CPU) 810, such as a conventional microprocessor, and a number of other units interconnected via system bus 812. Workstation 813 includes random access memory (RAM) 814, read only memory (ROM) 816, and input/output (I/O) adapter 818 for connecting peripheral devices such as disk units 820 and tape drives 840 to bus 812, user interface adapter 822 for connecting keyboard 824, mouse 826, and/or other user interface devices such as a touch screen device (not shown) to bus 812, communication adapter 834 for connecting workstation 813 to a data processing network, and display adapter 836 for connecting bus 812 to display device 838. CPU 810 may include other circuitry not shown herein, which will include circuitry commonly found within a microprocessor, e.g., execution unit, bus interface unit, arithmetic logic unit, etc. CPU 810 may also reside on a single integrated circuit.

Any of the devices shown within system 813 may employ logic circuitry that utilizes circuitry the same as or similar to circuits 400 or 600.

Although the present invention and its advantages have been described in detail, it should be understood that various changes, substitutions and alterations can be made herein without departing from the spirit and scope of the invention as defined by the appended claims.

What is claimed is:

1. A dynamic logic circuit operable for reset during a precharge clock phase and to evaluate during an evaluate clock phase comprising:

first and second NFETs coupled in series between a first node and a first reference voltage, wherein gate electrodes of said first and second NFETs are operable for receiving a data input;

a first PFET coupled between a second reference voltage and a second node coupling said first and second NFETs, wherein a gate electrode of said first PFET is operable for receiving said data input, so that said first and second NFETs and first PFET reduce susceptibility to erroneous discharge of said first node during said evaluate phase; and a third NFET coupled between said second NFET and said first reference voltage, wherein said third NFET is operable for receiving a clock signal.

2. The logic circuit as recited in claim 1, wherein said first node is coupled to an output of said circuit.

3. The logic circuit as recited in claim 1, further comprising:

circuitry for resetting said first node.

4. The logic circuit as recited in claim 3, wherein said resetting circuitry further comprises:

a second PFET coupled between said second reference voltage and said first node, wherein a gate electrode of said second PFET is coupled to said output.

5. The logic circuit as recited in claim 4, further comprising:

a third PFET coupled between said second reference voltage and said first node, wherein said third PFET is operable for receiving said clock signal.

6. The logic circuit as recited in claim 4, further comprising:

an inverter coupled between said first node and said output.

7. The logic circuit as recited in claim 1, wherein said logic circuit is a multiplexer.

8. A data processing system comprising:

a processor;

an input device;

an output device;

a memory device; and a bus system coupling said processor to said input device, said output device, and said memory device, wherein said processor includes domino logic operable for reset during a precharge clock phase and to evaluate during an evaluate clock phase, comprising:

first and second NFETs coupled in series between a first node and a first reference voltage, wherein gate electrodes of said first and second NFETs are operable for receiving a data input;

a first PFET coupled between a second reference voltage and a second node coupling said first and second NFETs, wherein a gate electrode of said first PFET is operable for receiving said data input, so that said first and second NFETs and first PFET reduce susceptibility to erroneous discharge of said first node during said evaluate phase; and a third NFET coupled between said second NFET and said reference voltage wherein said third NFET is operable for receiving a clock signal.

9. The data processing system as recited in claim 8, wherein said first node is coupled to an output of said circuit.

10. The data processing system as recited in claim 8, further comprising:

circuitry for resetting said first node.

11. The data processing system as recited in claim 10, wherein said resetting circuitry further comprises:

a second PFET coupled between said second reference voltage and said first node, wherein a gate electrode of said second PFET is coupled to said output.

12. The data processing system as recited in claim 11, further comprising:

a third PFET coupled between said second reference voltage and said first node, wherein said third PFET is operable for receiving said clock signal.

13. The data processing system as recited in claim 12, further comprising:

an inverter coupled between said first node and said output.

14. The data processing system as recited in claim 11, wherein said circuit is a multiplexer.

15. The data processing system as recited in claim 14, further comprising:

third and fourth NFETs coupled in series between said first node and said first reference voltage, wherein gate electrodes of said third and fourth NFETs are operable for receiving a second data input; and a second PFET coupled between second reference voltage and a third node coupling said third and fourth NFETs, wherein a gate electrode of said second PFET is operable for receiving said second data input.

16. A data processing system comprising:

a processor;

an input device;

an output device;

a memory device; and a bus system coupling said processor to said input device, said output device, and said memory device, wherein said processor includes domino logic circuitry, comprising:

first and second NFETs coupled in series between a first node and a first reference voltage, wherein gate electrodes of said first and second NFETs are operable for receiving a data input;

a first PFET coupled between a second reference voltage and a second node coupling said first and second NFETs, wherein a gate electrode of said first PFET is operable for receiving said data input;

third and fourth NFETs coupled in series between said first node and said first reference voltage, wherein gate electrodes of said third and fourth NFETs are operable for receiving a second data input; and a second PFET coupled between said second reference voltage and a third node coupling said third and fourth NFETs, wherein a gate electrode of said second PFET is operable for receiving said second data input.

17. The logic circuit of claim 1 wherein said first NFBT and said first PFET are operable for controlling a beta ratio of said logic circuit.

18. A method in a dynamic logic circuit of reducing the susceptibility to erroneous discharge comprising the steps of:

switching on a first NFET in response to an evaluate phase of a clock signal;

switching on a second NFET in response to a first predetermined value of a data signal, wherein said second NFET is serially coupled between said first NFET and an first node of said circuit;

switching off a first PFET in response to said first value of said data signal, said PFET being coupled between a first voltage reference and a second node between said second NFET and a third NFET, said third NFET being serially coupled between said first node and said second NFET;

switching on said third NFET in response to said first value of said data signal; and switching off said third NFET in response to a second value of said data signal, so that said second and third NFETs and said first PFET reduce susceptibility to erroneous discharge of said first node during said evaluate.

19. The method of claim 18 further comprising the step of resetting said first node in response to a precharge phase of said clock signal.

20. The method of claim 19 wherein said step of resetting said first node comprises the step of switching on a second PFET, said second PFET coupled between said first node and said first reference voltage.

21. The method of claim 18 further comprising the step of latching said first node during evaluate phase of said clock signal, when said first node has a first predetermined signal value.

22. The method of claim 18 further comprising the steps of:

inverting a signal value on said first node; and outputting an inverted signal value from said inverting step on a third node.

23. The method of claim 18 wherein said third NFET and said PFET are operable for controlling a beta ratio of said logic circuit.

24. The logic circuit of claim 1 wherein said first NFET and said first PFET have a predetermined beta ratio for controlling an input noise margin of said logic circuit.

* * * * *

UNITED STATES PATENT AND TRADEMARK OFFICE
CERTIFICATE OF CORRECTION

PATENT NO. : 6,667,637 B1
DATED : December 23, 2003
INVENTOR(S) : Donald George Mikan, Jr.

It is certified that error appears in the above-identified patent and that said Letters Patent is hereby corrected as shown below:

Column 6,
Line 10, please replace "NFBT" with -- NFET --.

Signed and Sealed this

Twenty-seventh Day of July, 2004

JON W. DUDAS
*Acting Director of the United States Patent and Trademark Office*